United States Patent
Yang et al.

(10) Patent No.: US 11,043,514 B2
(45) Date of Patent: Jun. 22, 2021

(54) METHOD OF FABRICATING ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Wei Yang, Beijing (CN); Xinhong Lu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 31 days.

(21) Appl. No.: 16/486,990

(22) PCT Filed: Dec. 11, 2018

(86) PCT No.: PCT/CN2018/120250
§ 371 (c)(1),
(2) Date: Aug. 19, 2019

(87) PCT Pub. No.: WO2019/174333
PCT Pub. Date: Sep. 19, 2019

(65) Prior Publication Data
US 2020/0357829 A1    Nov. 12, 2020

(30) Foreign Application Priority Data
Mar. 15, 2018    (CN) .......................... 201810215915.2

(51) Int. Cl.
*H01L 27/12* (2006.01)
*H01L 29/66* (2006.01)
(Continued)

(52) U.S. Cl.
CPC ........ *H01L 27/1255* (2013.01); *H01L 27/124* (2013.01); *H01L 27/1225* (2013.01);
(Continued)

(58) Field of Classification Search
None
See application file for complete search history.

(56) References Cited

U.S. PATENT DOCUMENTS

2007/0228382 A1*  10/2007  Yamazaki ........... H01L 51/5259
                                                                 257/72
2008/0297711 A1    12/2008  Kawasaki
(Continued)

FOREIGN PATENT DOCUMENTS

CN        101436608 A       5/2009
CN        106876412 A       6/2017
(Continued)

OTHER PUBLICATIONS

First Office Action and English language translation, CN Application No. 201810215915.2, dated Mar. 31, 2020, 13 pp.

*Primary Examiner* — Bo B Jang
(74) *Attorney, Agent, or Firm* — Myers Bigel, P.A.

(57) ABSTRACT

A method of fabricating an array substrate, an array substrate, and a display device is disclosed. The array substrate comprises a display area and a wiring area. The display area is disposed with a first thin film transistor and a second thin film transistor. A distance between a first active layer of the first thin film transistor and a substrate is different from a distance between a second active layer of the second thin film transistor and the substrate. The first thin film transistor comprises first vias that receive a first source/drain. The second thin film transistor includes second vias that receives a second source/drain. The wiring area is provided with a groove. The groove comprises a first sub-groove and a second sub-groove that are stacked. The method includes simultaneously forming the first vias and the first sub-groove, and simultaneously forming the second vias and the second sub-groove.

17 Claims, 6 Drawing Sheets

(51) Int. Cl.
*H01L 29/786* (2006.01)
*H01L 27/32* (2006.01)

(52) U.S. Cl.
CPC ...... *H01L 27/1251* (2013.01); *H01L 27/1259* (2013.01); *H01L 29/66757* (2013.01); *H01L 29/66969* (2013.01); *H01L 29/7869* (2013.01); *H01L 29/78675* (2013.01); *H01L 27/3262* (2013.01); *H01L 27/3265* (2013.01)

(56) References Cited

U.S. PATENT DOCUMENTS

| | | | |
|---|---|---|---|
| 2009/0078939 A1* | 3/2009 | Yamazaki | H01L 21/76254 257/59 |
| 2009/0128023 A1 | 5/2009 | Kwak et al. | |

FOREIGN PATENT DOCUMENTS

| | | |
|---|---|---|
| CN | 108288621 A | 7/2018 |
| WO | 2019/169848 A1 | 9/2019 |

\* cited by examiner

METHOD OF FABRICATING ARRAY SUBSTRATE, ARRAY SUBSTRATE AND DISPLAY DEVICE

RELATED APPLICATION

The present application is a 35 U.S.C. 371 national stage application of PCT International Application No. PCT/CN2018/120250, filed on Dec. 11, 2018, which claims the benefit of Chinese Patent Application No. 201810215915.2, filed on Mar. 15, 2018, the entire disclosures of which are incorporated herein by reference.

TECHNICAL FIELD

The present disclosure relates to the field of display technologies, and in particular, to a method of fabricating an array substrate, an array substrate and a display device.

BACKGROUND

Both low temperature poly-silicon (LTPS) thin film transistors and oxide thin film transistors can be used in display devices, and array substrates in which oxide thin film transistors and low temperature poly-silicon thin film transistors are combined have currently appeared. However, the fabrication processes of these two kind of thin film transistors are incompatible and may result in problems such as poor process stability, long production cycle, complicated process and high process cost.

SUMMARY

According to an aspect of the present disclosure, a method of fabricating an array substrate is provided. The array substrate comprises a display area and a wiring area. The display area is disposed with a first thin film transistor and a second thin film transistor. A distance between a first active layer of the first thin film transistor and a substrate is different from a distance between a second active layer of the second thin film transistor and the substrate. A first source/drain of the first thin film transistor is electrically connected to the first active layer through first vias. A second source/drain of the second thin film transistor is electrically connected to the second active layer through second vias. The wiring area is disposed with a groove, and the groove comprises a first sub-groove and a second sub-groove that are stacked. The method comprises simultaneously forming the first vias and the first sub-groove, and simultaneously forming the second vias and the second sub-groove.

In some embodiments, depths of the first vias are substantially equal to a depth of the first sub-groove.

In some embodiments, the method further comprises: after the step of simultaneously forming the first vias and the first sub-groove and before the step of simultaneously forming the second vias and the second sub-groove, forming the first source/drain.

In some embodiments, the method further comprises: after the step of simultaneously forming the second vias and the second sub-groove, simultaneously forming the second source/drain and a first connection line, wherein the first connection line is connected to the first source/drain.

In some embodiments, the method further comprises: after the step of forming the first source/drain and before the step of simultaneously forming the second vias and the second sub-groove, forming a passivation layer which covers the first source/drain.

In some embodiments, the step of simultaneously forming the second via and the second sub-groove comprises: simultaneously forming the second via, the second sub-groove and a third via which penetrates the passivation layer, wherein the third via extends to a surface of the first source/drain and is configured to receive the first connection line.

In some embodiments, the step of simultaneously forming the second source/drain and the first connection line comprises: simultaneously forming a wiring in the wiring area, the second source/drain and the first connection line, wherein at least a portion of the wiring covers the passivation layer.

In some embodiments, the method further comprises: after the step of forming the second source/drain and the first connection line, forming a passivation layer which covers the first source/drain, the second source/drain and the first connection line.

In some embodiments, the method further comprises: after forming the passivation layer, forming a first planarization layer which fills the groove; forming fourth vias which penetrate the first planarization layer, wherein two of the fourth vias extend to surfaces of the second source/drain; and simultaneously forming a wiring in the wiring area and second connection lines, wherein two of the second connection lines are connected to the second source/drain penetrating the two of the fourth vias, and the wiring covers the first planarization layer.

In some embodiments, the step of simultaneously forming the second source/drain and the first connection line further comprises: simultaneously forming the second source/drain, the first connection line and a first auxiliary electrode, wherein the first auxiliary electrode is insulated from the second source/drain. The step of simultaneously forming the wiring in the wiring area and the second connection lines further comprises: simultaneously forming the second connection lines, the wiring and a second auxiliary electrode, wherein an orthographic projection of the second auxiliary electrode on the substrate at least partially overlaps with an orthographic projection of the first auxiliary electrode on the substrate.

In some embodiments, the step of simultaneously forming the second via and the second sub-groove comprises: etching a portion of a bottom of the first sub-groove to form the second sub-groove.

In some embodiments, the first thin film transistor is an oxide thin film transistor, and the second thin film transistor is a low temperature poly-silicon thin film transistor.

According to another aspect of the present disclosure, an array substrate is provided. The array substrate comprises a display area and a wiring area. The display area is disposed with a first thin film transistor and a second thin film transistor. A distance between a first active layer of the first thin film transistor and a substrate is different from a distance between a second active layer of the second thin film transistor and the substrate. A first source/drain of the first thin film transistor is electrically connected to the first active layer through a first via. A second source/drain of the second thin film transistor is electrically connected to the second active layer through second vias. The wiring area is disposed with a groove. The groove comprises a first sub-groove and a second sub-groove that are stacked. Depths of the first vias are substantially equal to a depth of the first sub-groove.

In some embodiments, the array substrate further comprises a passivation layer and a wiring. The passivation layer covers the first source/drain, and the second source/drain is connected to the second active layer through the second vias penetrating the passivation layer. The wiring is in the wiring area and at least partially covers the passivation layer. The second source/drain and the wiring are disposed in the same layer and are of the same material.

In some embodiments, the array substrate further comprises: a passivation layer covering the first source/drain and the second source/drain; a first connection line connecting one electrode of the first source/drain to one electrode of the second source/drain; a first auxiliary electrode insulated from the second source/drain; a planarization layer covering the passivation layer and filling the groove; second connection lines, wherein two of the second connection lines are connected to the second source/drain through two of fourth vias penetrating the passivation layer and the planarization layer; a second auxiliary electrode insulated from the second connection line wherein the second auxiliary electrode is on the planarization layer; and a wiring in the wiring area wherein the wiring covers the planarization layer. The second source/drain, the first connection line, and the first auxiliary electrode are in the same layer and are of the same material, and the second connection lines, the second auxiliary electrode, and the wiring are in the same layer and are of the same material.

In some embodiments, an orthographic projection of the first auxiliary electrode on the substrate at least partially overlaps with an orthographic projection of the second auxiliary electrode on the substrate.

According to yet another aspect of the present disclosure, a display device is provided. The display device comprises the array substrate as described in any one of the embodiments of the present disclosure.

BRIEF DESCRIPTION OF THE DRAWINGS

The above and/or additional aspects and advantages of the present disclosure will become apparent and readily understood from the description of embodiments with reference to the following drawings, in which.

DETAILED DESCRIPTION OF THE EMBODIMENTS

With the development of semiconductor manufacturing technology and display technology, users' requirements for the performance of display devices have also increased. For example, display devices with high definition, high contrast, and high aperture ratio are increasingly popular with users.

In addition, new display devices using technologies such as flexible screens, narrow or free of bezels have also shown great market prospects. Array substrates, such as back plates of organic light emitting display devices, are important components that affect the performance of the display devices. Thin film transistors are important switching control components in array substrates. In recent years, low temperature poly-silicon thin film transistors and oxide thin film transistors have attracted much attention in the display industry. The low temperature poly-silicon thin film transistor, the active layer of which is made of a poly-silicon material, has advantages of high carrier mobility and fast charging. The oxide thin film transistor, the active layer of which is made of an oxide material such as IGZO, has an advantage of small leakage current. Therefore, an array substrate in which an oxide thin film transistor and a low temperature poly-silicon thin film transistor are combined has appeared.

However, currently, the array substrate comprising multiple kinds of thin film transistors (such as low temperature poly-silicon thin film transistors and oxide thin film transistors) and the manufacturing method thereof, generally have problems such as poor manufacturing stability, long manufacturing period, complicated process and high cost. This is mainly because the poor compatibility of the fabrication processes of the low-temperature poly-silicon thin film transistor and the oxide thin film transistor.

Figure 1:
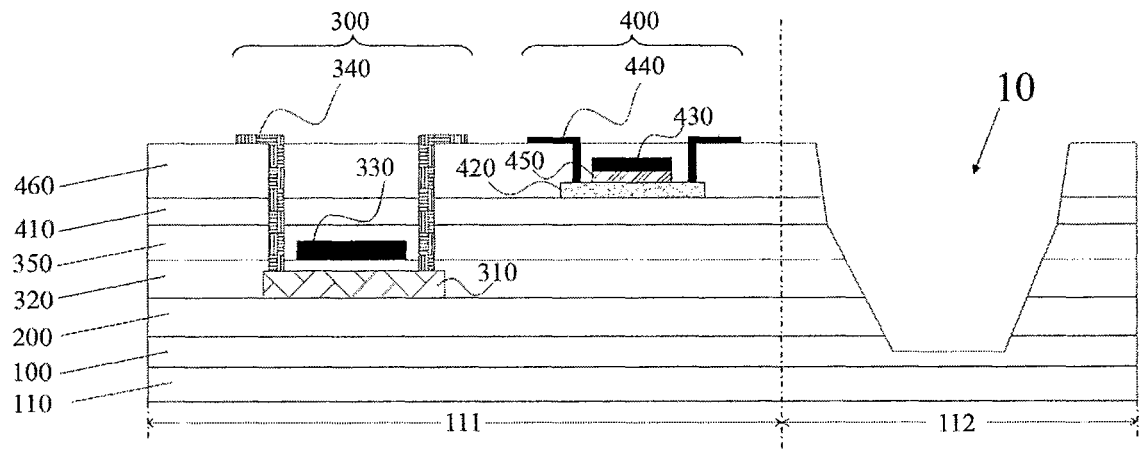
FIG. 1 schematically shows a related array substrate comprising two kinds of thin film transistors.

FIG. 1 schematically shows a related array substrate comprising two kinds of thin film transistors. These two kinds of thin film transistors may be a low temperature poly-silicon thin film transistor and an oxide thin film transistor. In this array substrate, the source/drains of the two kinds of transistors (i.e., the first source/drain 440 of the oxide thin film transistor and the second source/drain 340 of the low temperature poly-silicon thin film transistor) are disposed in the same layer. The term "disposed in the same layer" does not mean that the entireties of the structures are disposed in the one and only layer; instead, it may means that a portion of a first structure and a portion of a second structure are co-existent in the same layer. The first source/drain 440 of the oxide thin film transistor is connected to an active layer (i.e., the first active layer 420) of the oxide thin film transistor through first vias. The second source/drain 340 of the low temperature poly-silicon thin film transistor is connected to an active layer (i.e., the second active layer 310) of the low temperature poly-silicon thin film transistor through second vias. The thickness of the insulating layers above the low temperature poly-silicon thin film transistor (comprising a second interlayer insulating layer 350, a first buffer layer 410 and a first interlayer insulating layer 460) is larger than the thickness of the insulating layer above the oxide thin film transistor (comprising the first interlayer insulating layer 460) due to the difference in materials of the active layers. Therefore, if the two kinds of thin film transistors are formed in the one and same etching process, the moment the vias of the oxide thin film transistor reach the oxide semiconductor active layer, the vias of the low temperature poly-silicon thin film transistor has not yet reached the poly-silicon active layer. In the continuing process of forming the vias of the low temperature poly-silicon thin film transistor, the active layer of the oxide thin film transistor is easily affected, such that the switching characteristics of the oxide thin film transistor may be harmed. In addition, before the active layer of the low temperature poly-silicon thin film transistor is in contact with the source/drain, it is needed to clean the surfaces of the low temperature poly-silicon active layer which is exposed through the vias with hydrofluoric acid to remove the surface oxide layers, such that a good ohm contact can be formed between the low temperature poly-silicon active layer and the subsequently formed source/drain of the low temperature poly-silicon film transistor. However, the cleaning process may affect the oxide semiconductor active layer, thereby affecting the switching characteristics of the oxide thin film transistor. For the above reasons, the fabrication processes of the low temperature poly-silicon thin film transistor and the oxide thin film transistor are not compatible. Therefore, it is necessary to design a fabrication method that can solve the incompatibility of the low temperature poly-silicon thin film transistor and the oxide thin film transistor. In addition, since display devices are expected to have narrow or free of bezels, as well as flexible display functions, it is desirable that such a fabrication method can simultaneously meet other requirements.

Embodiments of the present disclosure are described in detail below with reference to the accompanying drawings. The same or similar reference numerals indicate the same or similar elements or elements having the same or similar functions throughout the disclosure. The embodiments described below with reference to the drawings are exemplary. They intend to explain the present disclosure only, and should not be understood as a limitation of the present disclosure.

In one aspect of the disclosure, a method of fabricating an array substrate is provided. The array substrate may comprise multiple kinds of thin film transistors. Specifically, depths of the active layers of different kinds of thin film transistors may be inconsistent. The term "depth" may mean the distance from the substrate to the active layer in a direction perpendicular to the substrate. The array substrate comprises a display area 111 and a wiring area 112. The wiring area 112 has a groove. The first thin film transistor 400 is connected in series with the second thin film transistor 300. The first thin film transistor 400 and the second thin film transistor 300 may be located in the display area 111 and may also be located in the wiring area 112. The array substrate may be a back plate of an organic light emitting display device. For example, the array substrate may be a back plate of a screen having narrow bezel even no bezel or a flexible screen of an organic light emitting display device. The substrate 100 of the array substrate may be a flexible substrate, e.g. a substrate formed of polyimide (PI).

In an embodiment of the present disclosure, the array substrate may comprise both oxide thin film transistors and low temperature poly-silicon thin film transistors. In some embodiments, the first thin film transistor 400 may be the oxide thin film transistor, and the second thin film transistor 300 may be the low temperature poly-silicon thin film transistor. It should be noted that the above-described specific types of the first thin film transistor and second thin film transistor are merely examples. Other types of transistors are equally applicable to the present disclosure. The specific types are not particularly limited in the present disclosure.

Figure 2:
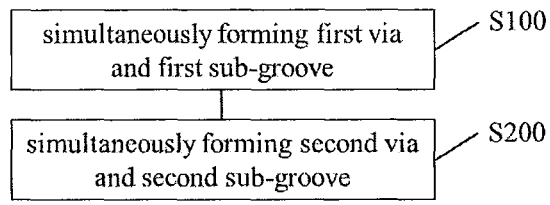
FIG. 2 schematically shows a flow chart of a method of fabricating an array substrate in accordance with an embodiment of the present disclosure.

FIG. 2 schematically shows a method of fabricating an array substrate in accordance with an embodiment of the present disclosure. The method comprises:

S100: simultaneously forming first vias and a first sub-groove, and

S200: simultaneously forming second vias and a second sub-groove.

The term "simultaneously forming" means that two or more structures are formed in the same process step, which means the two or more structures are formed a single exposure process using a single mask. In contrast to the method of simultaneously forming the first vias and the second vias, in the method according to an embodiment of the present disclosure, the first vias and the second vias are independently formed. This method can solve the above-described problem of incompatibility. Specifically, this method can avoid the problem of over-etching of the active layer of one of the thin film transistors due to the difference in the depths of the vias of the two kinds of thin film transistors. In addition, since the two kinds of vias are formed in two steps, before cleaning the active layer at a deeper position (i.e., closer to the substrate 100), the active layer at a shallower position can be protected in advance to prevent corrosion.

In addition, in view of the current display device, particularly the organic light-emitting flexible display device, in order to improve the bendability of the display panel, needs to etch away multilayer inorganic structures (e.g., the interlayer insulating layer, the passivation layer, etc.) in the wiring area 112 to remove the brittle inorganic layers that are prone to crack during bending, and, for the purpose of ensuring etching precision and product yield, the process of removing inorganic structures generally comprises two steps (i.e., forming a first sub-groove and forming a second sub-groove, with the first sub-groove and the second sub-groove being stacked, and the first sub-groove being further away from the substrate than the second sub-groove), the process of removing the inorganic structures may be combined with the processes of forming the first vias and the second vias. For example, form the first sub-groove while forming the first vias, and form the second sub-groove while forming the second vias. In this way, the incompatible manufacturing processes of the two thin film transistors can be solved and the etching precision of the wiring area can be guaranteed without significantly increasing the complexity of the production process.

A method of fabricating an array substrate in accordance with an embodiment of the present disclosure is described in more detail below.

Figure 3:
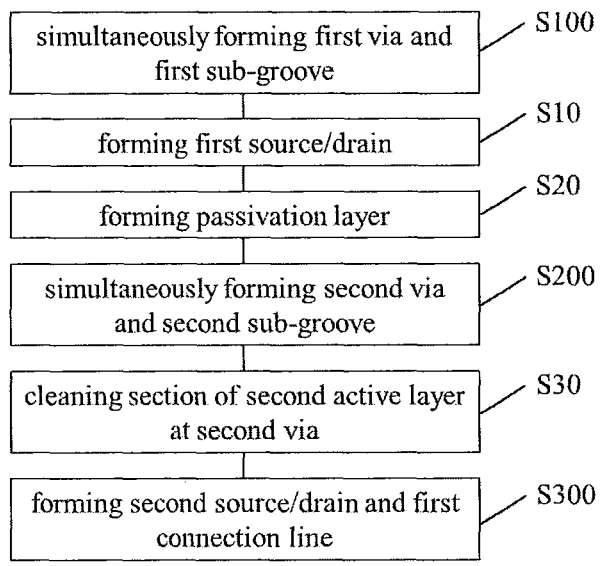
FIG. 3 schematically shows a flow chart of a method of fabricating an array substrate in accordance with another embodiment of the present disclosure.

FIG. 3 schematically shows a flow chart of a method of fabricating an array substrate in accordance with another embodiment of the present disclosure. The method can comprise the following steps:

S100: simultaneously forming first vias and a first sub-groove;

S10: forming a first source/drain;

S20: forming a passivation layer;

S200: simultaneously forming second vias and a second sub-groove;

S30: cleaning the sections of the second active layer at the second vias; and

S300: forming a second source/drain and a first connection line.

Figure 4A:
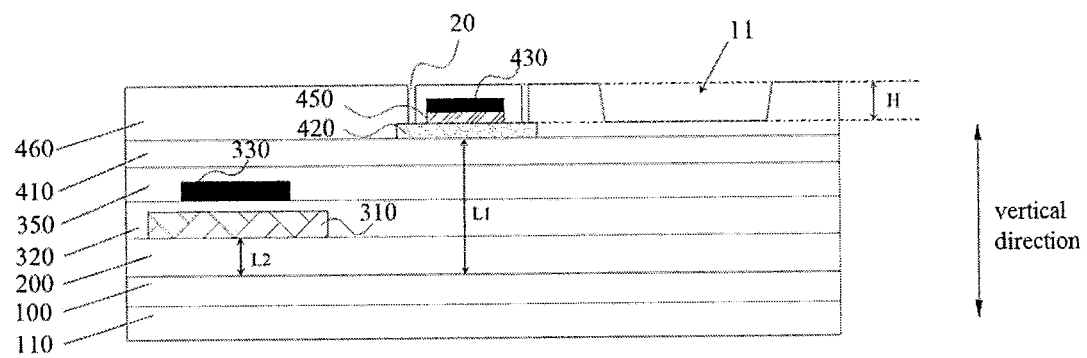
FIG. 4A-4E schematically show structures of an array substrate in certain stages of the method of FIG. 3.

FIG. 4A-4E schematically show the structures of an array substrate in certain stages of the method of FIG. 3. FIG. 4A shows the structure of the array substrate after the realization of step S100. The distance L1 between the first active layer 420 of the first thin film transistor and the substrate 100 is different from the distance L2 between the second active layer 310 of the second thin film transistor and the substrate 100. In step S100, the first vias 20 and the first sub-groove 11 may be formed in the one and same patterning process. More specifically, after forming the first interlayer insulating layer 460, the first vias 20 and the first sub-groove 11 can be formed in the one and same process by photoresist coating, exposure by means of a mask, development, etching, and stripping. The specific parameters of the patterning process are not particularly limited. The patterning process can be either dry etching or wet etching.

Since the first sub-groove 11 and the first vias 20 are formed in the same process, the depth of the first sub-groove 11 and the depths of the first vias 20 may both be H as shown in FIG. 4A. The depth of the etching can be controlled to prevent damage to the sections of first active layer 420 at the first vias 20 due to the depth of the first vias 20 being too deep.

The (base) substrate 100 of the array substrate can be formed by a flexible material. In this case, the flexible substrate may be placed on a glass substrate 110 to perform the fabrication process. The array substrate may further comprise structures such as a second buffer layer 200, a second gate insulating layer 320, a second gate 330, a second interlayer insulating layer 350, a first buffer layer 410, and a first gate 430. The specific positions and materials of the above-described structures are not particularly limited. Those skilled in the art can make a selection according to actual conditions. For example, the second buffer layer 200 may be a single-layer structure or a multilayer structure. The remaining layers, such as the interlayer insulating layers, the gate insulating layers, the gates, etc., may be selected according to the materials of the active layer and specific requirements for the array substrate of different products.

Figure 4B:
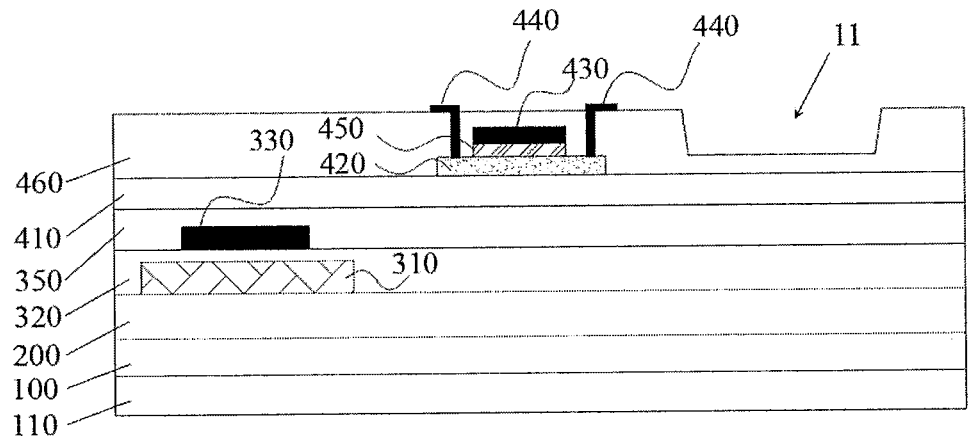

In some embodiments, after forming the first vias 20 and the first sub-groove 11, the first source/drain 440 may be formed (step S10). The first source/drain 440 is electrically connected to the first active layer 420 through the first vias 20. It should be understood that the term "source/drain" refers to a collection of a source and a drain, and one electrode of the source/drain is the source and the other one is the drain. FIG. 4B schematically shows the structure of the array substrate after the step S10, that is, after the first source/drain 440 has been formed. The first source/drain 440 can be formed by conventional deposition and patterning processes. The formed first source/drain 440 fills the first vias 20, and the sections of first active layer 420 at the first via 20 are covered by the first source/drain 440, so the first source/drain 440 can protect the sections of the first active layer 420 at the first vias 20.

Figure 4C:
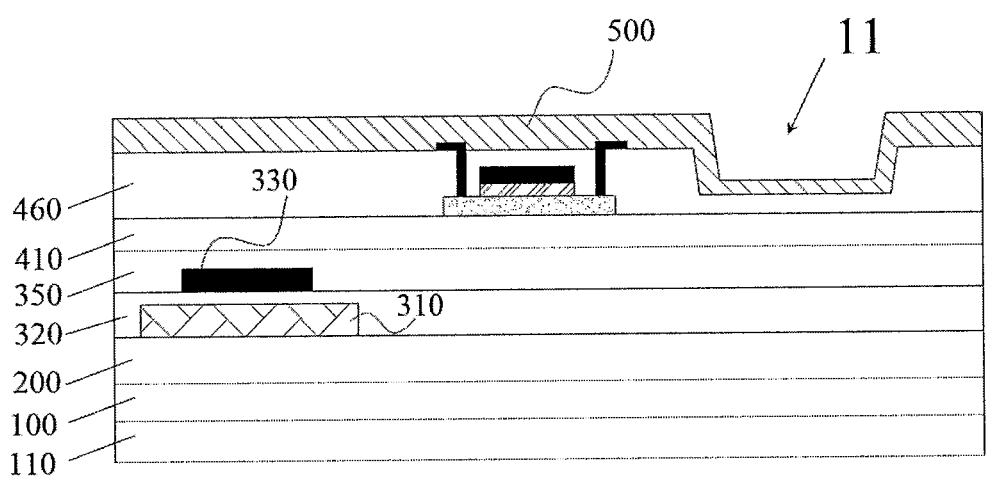

After forming the first source/drain 440, the passivation layer 500 may be formed. FIG. 4C schematically shows the structure of the array substrate after the step S30, that is, after forming the passivation layer 500. The material of the passivation layer 500 is not particularly limited, as long as the thin film transistor can be protected. Those skilled in the art can select a suitable material to form the passivation layer 500.

Figure 4D:
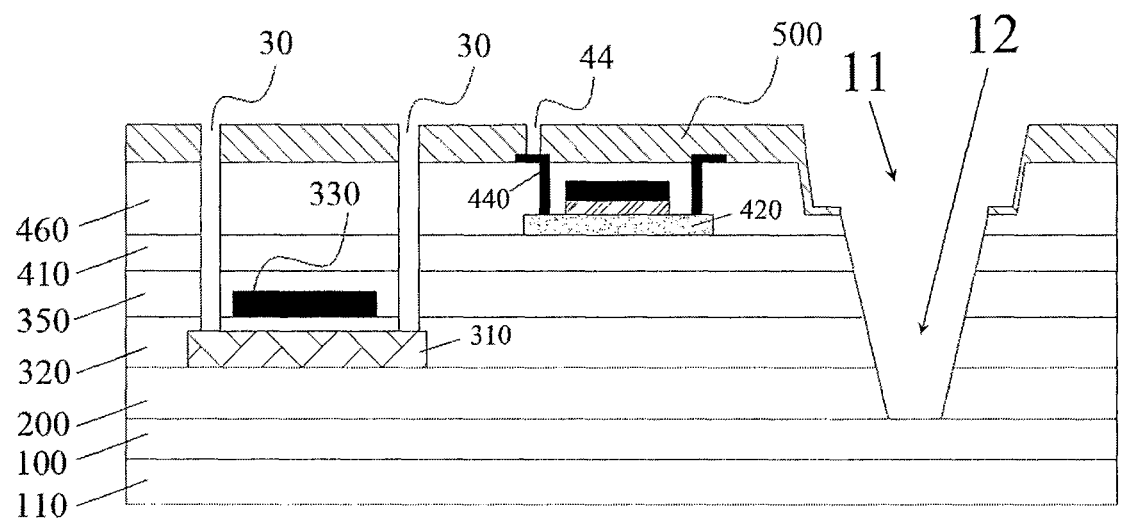

After forming the passivation layer 500, the second sub-groove 12 and the second vias 30 may be simultaneously formed (step S200). The second vias are formed by etching the passivation layer 500, the first interlayer insulating layer 460, the first buffer layer 410, the second interlayer insulating layer 350 and the second gate insulating layer 320. The depth of the second sub-groove 12 is not limited. FIG. 4D schematically shows the array substrate after the step S200, that is, after forming the second sub-groove 12 and the second vias 30. Since the second vias 30 of the second thin film transistor is not formed simultaneously together with the first vias 20 of the first thin film transistor, the problem of over-etching of the shallower active layer (i.e., the first active layer 420) when simultaneously forming the two kinds of vias due to the difference in the depths of the two kinds of vias can be avoided. Moreover, since the above-described two kinds of vias are respectively formed simultaneously with other structures, the production process is not prolonged.

In some embodiments, the second vias 30 and the second sub-groove 12 may be formed by a patterning process similar to the formation of the first vias 20 and the first sub-groove 11, e.g. by dry etching or wet etching. By forming the first sub-groove 11 and the second sub-groove 12, a portion of the inorganic layer structure at the wiring area 112 can be removed to improve the mechanical performance of the array substrate. In addition, since the groove is formed by two steps, it is possible to avoid the difficulty in controlling the etching precision caused by the one-step process of forming the grooves, which may affect the product yield. The specific shapes and positions of the first sub-groove 11 and the second sub-groove 12 are not particularly limited, as long as the above-described effects can be achieved. For example, in some embodiments, the width of the first sub-groove 11 and the width of the second sub-groove 12 may be equal, that is, the combination of the first sub-groove 11 and the second sub-groove 12 may constitute a groove with equal width at different depths. Alternatively, the gradients of the widths of the first sub-groove 11 and the second sub-groove 12 may be the same, that is, the side surface of the first sub-groove 11 and the side surface of the second sub-groove 12 form a continuous surface. In other embodiments, the widths of the first sub-groove 11 and the second sub-groove 12 may not be particularly limited. For example, the combination of the first sub-groove 11 and the second sub-groove 12 may constitute a groove with a step-like structure. Specifically, the width at each depth in the second sub-groove 12 is smaller than the width at each depth in the first sub-groove 11. In this case, the second sub-groove can be formed by etching a portion of the bottom of the first sub-groove. In some embodiments, the second sub-groove 12 may be formed by etching only a portion of the bottom of the first sub-groove 11 by dry etching. This can prevent the possible influences on the side surface of the first sub-groove 11 during the etching of the second sub-groove 12. In addition, the specific depth of the second sub-groove 12, that is, the distance between the bottom surface of the groove and the substrate 100 is not particularly limited. Those skilled in the art can make adjustments according to actual conditions, as long as the substrate 100 is not penetrated. For example, in some embodiments, the second sub-groove 12 may extend to a surface of the substrate 100 facing toward the second active layer 310. In other embodiments, there may be a (part of the) buffer layer 200 (which may be composed of an inorganic material) and/or other structures between the bottom of the second sub-groove 12 and the substrate 100. Thus, the mechanical performances of the wiring area 112 can be improved by using the flexibility of the substrate 100, and the inorganic structures of the wiring area 112 can be prevented from being broken or cracked during, for example, bending.

Since the passivation layer 500 covers the first source/drain 440 that has been formed, a third via 44 penetrating the passivation layer 500 and extending to the first source/drain 440 can be formed using the same patterning process while forming the second sub-groove 12 and the second vias 30.

After forming the second vias 30, the sections of the second active layer 310 at the second vias 30 may be cleaned (step S30). Since the sections of the first active layer 420 at the first vias 20 are covered by the first source/drain 440, the oxide on the surface of the second active layer 310 can be removed without affecting the performance of the first thin film transistor. Specifically, after forming the second vias 30, the exposed sections of the second active layer 310 may be cleaned using hydrofluoric acid or the like without worrying that the hydrofluoric acid may adversely affect the first active layer 420.

Figure 4E:
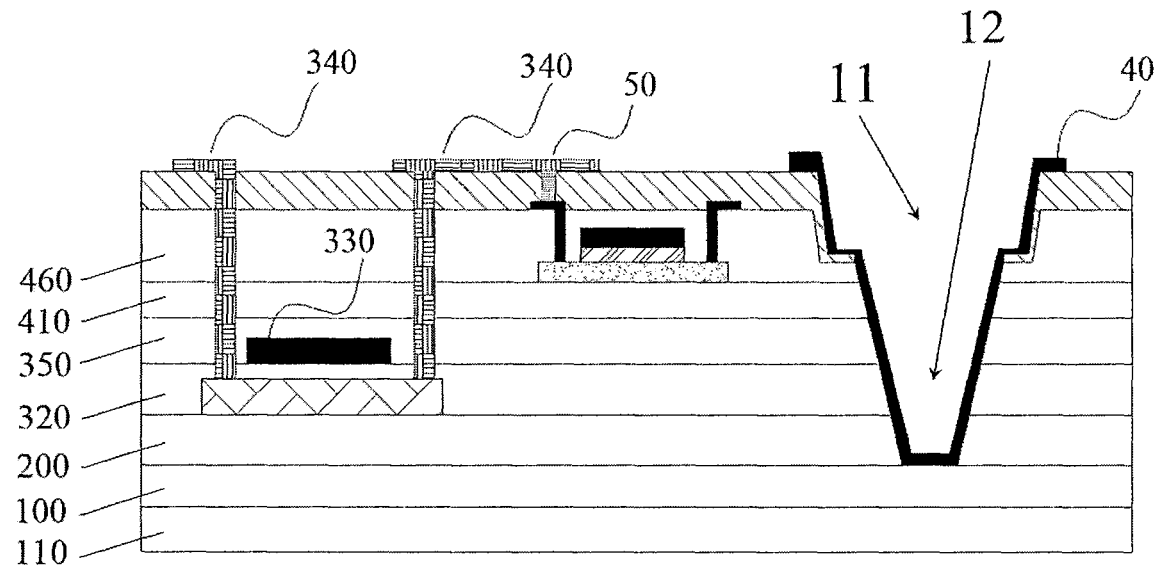

After forming the second vias 30, the second source/drain 240 and the first connection line 50 may be formed. The second source/drain 240 is electrically connected to the second active layer 310 through the second vias 30. FIG. 4E schematically shows the array substrate after the step S300, that is, after the second source/drain 240 and the first connection line 50 have been formed. Specifically, first, a metal layer may be deposited on the passivation layer 500 on which the second sub-groove 12, the second vias 30 and the third via 44 have been formed. Subsequently, the second source/drain 340 and the first connection line 50 are formed by a patterning process. The first connection line 50 connects one electrode of the second source/drain 340 and one electrode of the first source/drain 440. Specifically, one end of the first connection line 50 is connected to one electrode of the first source/drain 440 through the third via 44, and the other end is connected to one electrode of the second source/drain 340. In fact, the portion of the first connection line 50 above the passivation layer 500 and the portions of the second source/drain 340 over the passivation layer 500 are located in the same layer and are formed of the same material. In FIG. 4E, the first connection line 50 is disposed only on one electrode of the first source/drains 440, but it should be understood that the display panel may comprise another first connection line that is disposed on the other electrode of the first source/drains 440. In some embodiments, while forming the second source/drain 340 and the first connection line 50, the wiring 40 in the grooves may also be formed simultaneously. The wiring 40 can be used, for example, as a peripheral lead of the back plate to deliver a signal or electrical potential. In some embodiments, the wiring 40 can be used as a scan line, a data line, and the like. The material of the wiring 40 is the same as the second source/drain 340 and the first connection line 50, and a portion of the wiring 40 is on a side of the passivation layer 500 away from the substrate 100, and is on the same layer as the second source/drain 340 and the first connection line 50. A portion of the wiring 40 may cover the passivation layer 500 outside of the groove and/or in the groove. This method can further save production processes and improve production efficiency.

Thereafter, a planarization layer may be formed on the passivation layer 500 on which the second source/drain 340, the first connection line 50 and the wiring 40 have been formed, and a hole is formed in the planarization layer, and an anode of the electroluminescent device is formed. These steps or similar steps will be detailed in other embodiments herein.

It should be noted that the above-described first source/drain 440 and the second source/drain 340 should be understood in a broad sense. It will be understood by those skilled in the art that a thin film transistor is a switching device with three electrodes, comprising one control electrode (i.e., a gate), one source electrode, and one drain electrode. Which electrode of the source/drains is the source electrode (or which electrode of the source/drains is the drain electrode) and what is the direction of the current flowing through the source/drain are determined by the type of carrier (electron or hole) in the thin film transistor. Therefore, the directions of the currents flowing through the source/drains of the thin film transistors composed of different types of active layer materials are different. The first source/drain comprises the source electrode and the drain electrode of the first thin film transistor. The second source/drain comprises the source electrode and the drain electrode of the second thin film transistor. In the example that the first thin film transistor is an oxide thin film transistor and the second thin film transistor is a low temperature poly-silicon thin film transistor, the two kinds of thin film transistors are connected in series. The voltage signals in the signal line can be input into one electrode of the source/drain of one thin film transistor and output from the other electrode of the source/drains of the thin film transistor, and then delivered to the source electrode or the drain electrode of the other thin film transistor.

Figure 5:
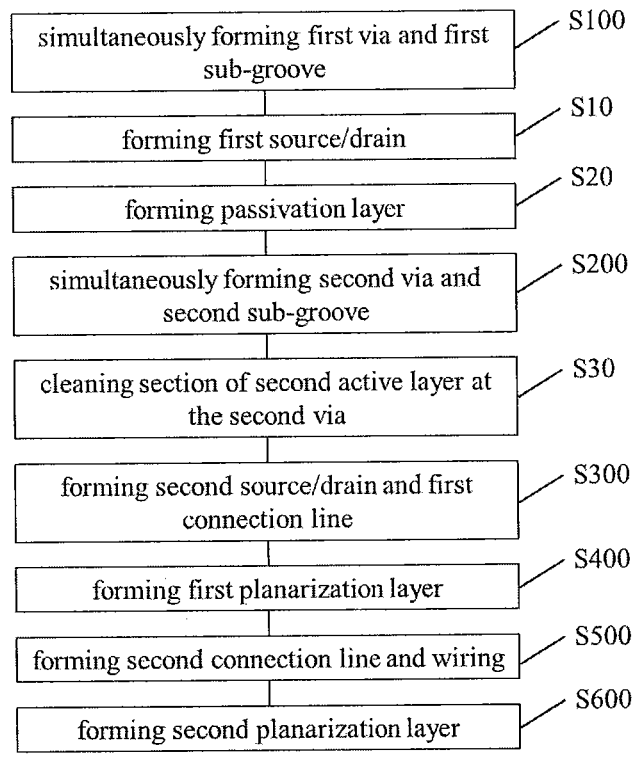
FIG. 5 schematically shows a flow chart of a method of fabricating an array substrate in accordance with yet another embodiment of the present disclosure.
Figure 6A:
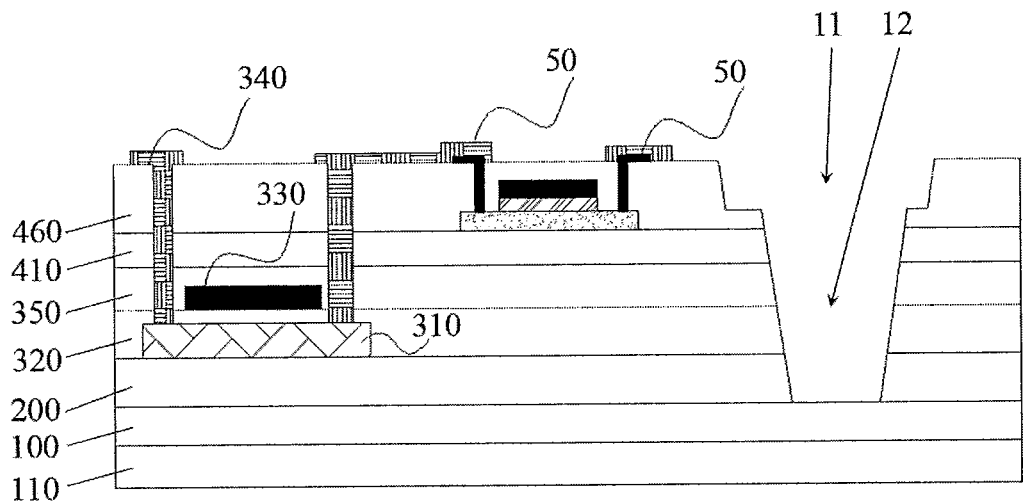
FIG. 6A-6B schematically show the structures of an array substrate in certain stages of the method of FIG. 5.
Figure 6B:
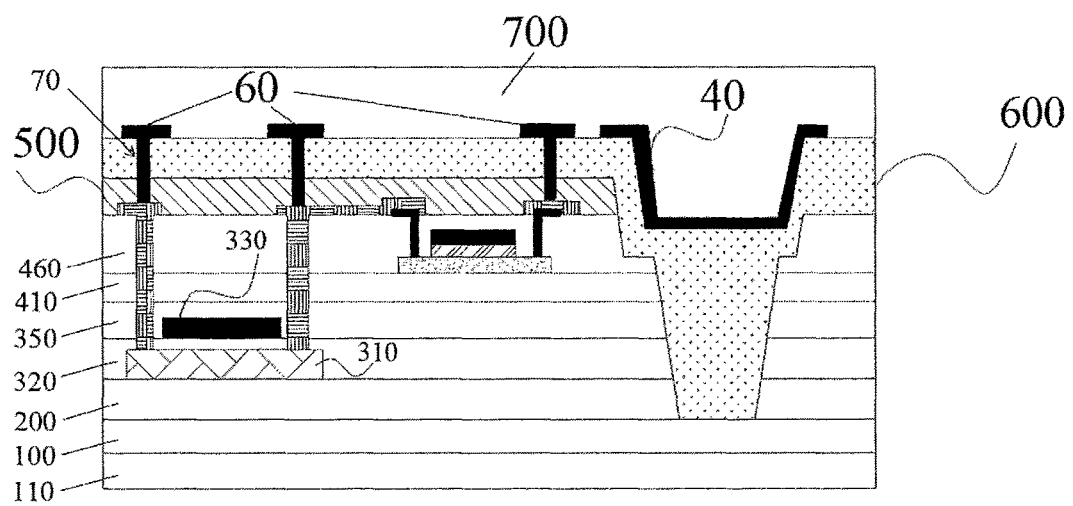

FIG. 5 schematically shows a flow chart of a method of fabricating an array substrate in accordance with yet another embodiment of the present disclosure. FIG. 6A-6B schematically show the structures of an array substrate in certain stages of the method of FIG. 5. This embodiment also comprises simultaneously forming the first vias and the first sub-groove (step S100) and forming the first source/drain (step S10). The structure of the array substrate after these two steps is identical to the structure shown in FIG. 4B. After forming the first source/drain 440, the passivation layer 500 may not be deposited temporarily; instead, the second vias 30 and the second sub-groove 12 may be simultaneously formed (step S200) firstly. Then, after cleaning the sections of the second active layer 310 at the second vias 30 (step S30), the second source/drain 340 and the first connection line 50 are formed. FIG. 6A schematically shows the array substrate after the second source/drain 340 and the first connection line 50 have been formed. The first connection line 50 connects the one electrode of first source/drain 440 and one electrode of the second source/drain 340. In some embodiments, the first connection line 50 and the second source/drain 340 are in the same layer and are of the same material. The first connection line 50 may cover one or both of two electrodes of the first source/drains 440.

Subsequently, the passivation layer 500 may be formed (step S20). The formation manner and material of the passivation layer 500 are not particularly limited. The formation process and materials of the passivation layer mentioned in the above embodiments of the present disclosure may be adopted, and the processes and materials familiar to those skilled in the art may also be selected according to actual needs to form the passivation layer 500, as long as the thin film transistor can be protected. The passivation layer 500 covers the first connection line 50 and the second source/drain 340. In some embodiments, the passivation layer 500 can cover only the display area 111. That is, the passivation layer 500 does not cover the groove of the wiring area 112.

After forming the passivation layer 500, the method may further comprise the following steps:

S400: forming a first planarization layer;
S500: forming second connection lines and a wiring; and
S600: forming a second planarization layer.

First, a first planarization layer 600 is formed. The first planarization layer 600 may be disposed at a side of the thin film transistor away from the substrate 100. Specifically, the first planarization layer may cover the previously formed passivation layer 500 and fill the groove. The material and fabrication process of the first planarization layer 600 are not particularly limited, and can be selected by those skilled in the art according to actual conditions. In some embodiments, the first planarization layer 600 can be composed of a transparent organic material. Thus, the first planarization layer 600 can be used to provide a flat surface for the subsequent process, and the mechanical performances of the finally formed array substrate can be enhanced and the flexibility of the wiring area can be improved since the first planarization layer 600 is filled into the interior of the groove. The first planarization layer 600 may have a uniform thickness. In other embodiments, the thickness of the first planarization layer 600 filled at the groove may be slightly thicker than the thickness of the first planarization layer 600 at other regions. Thus, the mechanical performances of the array substrate at the groove can be further improved. In some embodiments, the thickness of the first planarization layer 600 at the groove may be equal to the depth of the groove or may be slightly less than the depth of the groove. That is to say, after forming the first planarization layer 600, the groove may be filled up by the first planarization layer 600 or may not be filled up by the first planarization layer 600.

After forming the first planarization layer 600, the second connection lines 60 and the wiring 40 may be formed (step S500). Specifically, fourth vias 70 penetrating through the passivation layer 500 and the first planarization layer 600 may be formed firstly. The second connection lines 60 are connected to the second source/drain 340 through the fourth vias 70. In some embodiments, the second connection lines 60 connected to the second source/drain 340 and the wiring 40 in the groove can be simultaneously formed by depositing a metal layer and one patterning process. Thus, the fabrication process can be simplified, that is, the times of patterning processes may be reduced by one. The structure connecting the ends of the second connection lines 60 that are not connected to the second source/drain 340 is not particularly limited, as long as signal transmission can be achieved and the second thin film transistor can function. As described above, one electrode of the source/drain of the second thin film transistor may be connected in series with the first thin film transistor. In this case, the other electrode of the source/drains of the second thin film transistor is connected to the second connection line 60. The end of the second connection line 60 that is not connected to the second source/drain 340 can be connected to a signal line or a structure such as an anode of an organic light emitting diode (OLED). In addition, a second connection line 60 may also be formed on the electrode of the second source/drain 340 connected to the first source/drain 440 to reduce the resistance. A second connection line 60 may also be formed on the electrode of the first source/drain 440 that is not connected to the second source/drain 340. In some embodiments, the second sub-groove 12 may not be formed simultaneously with the second vias 30. For example, the second sub-groove 12 may be formed during forming the fourth vias 70. That is to say, regardless of the wiring condition of the connection between the second thin film transistor and the first thin film transistor, the second sub-groove 12 and the fourth vias 70 can be formed using the same mask. When forming the second connection lines 60, the specific connection situation of the second connection lines 60 can be designed according to different wiring conditions. In some embodiments, the second connection lines 60 can also serve as data lines, e.g. a power line VSS or a structure such as a gate drive circuit wiring connected to a control circuit. In some embodiments, the orthographic projection of the first connection line 50 on the substrate and the orthographic projection of second connection line 60 on the substrate can at least partially coincide. Therefore, by using the second connection line 60 that is not disposed in the same layer as the second source/drain 340 and the first connection line 50, the plurality of data lines that are originally located in the same layer and have the same extending directions can be changed to overlap in a direction perpendicular to the substrate, thereby facilitating the reduction of the area occupied by the wiring area and realizing narrow bezels or even full screens free of bezels.

After forming the second connection lines 60 and the wiring 40, a second planarization layer 700 may be formed (step S600). The specific position of the second planarization layer 700 is not particularly limited. For example, the second planarization layer 700 can be above the display area 111 and the wiring area 112. Thereby, the second planarization layer 700 can further fill the groove of the wiring area 112, to improve the flexibility of the array substrate and save the production process.

Figure 7:
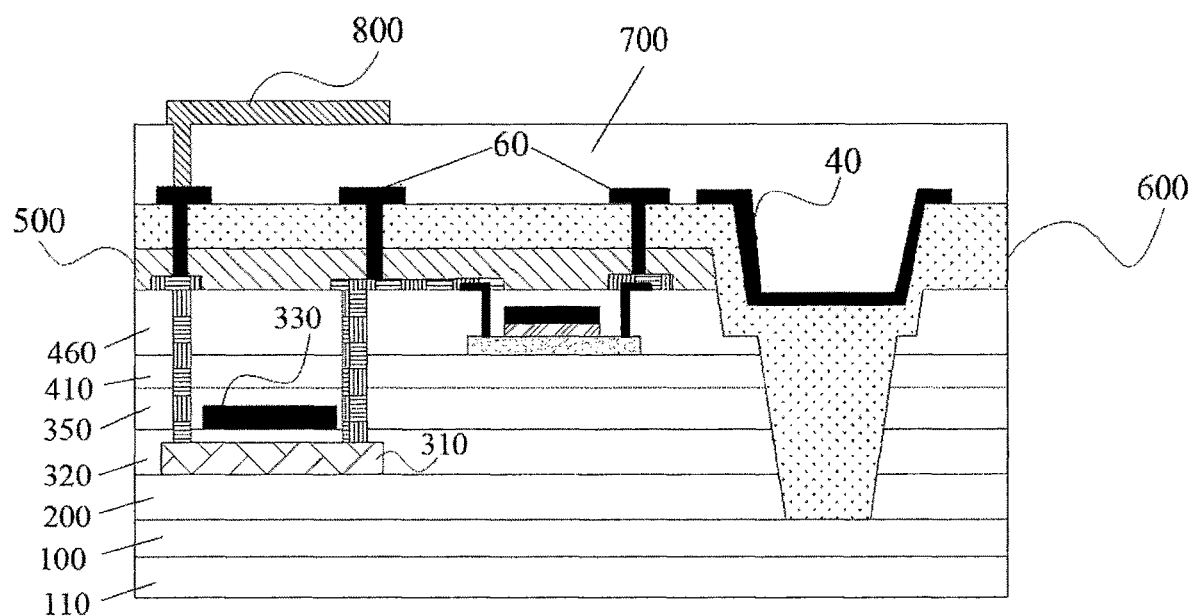
FIG. 7 schematically shows an array substrate in accordance with an embodiment of the present disclosure.

In some embodiments, the array substrate can be a back plate of an OLED. FIG. 7 schematically shows an array substrate in accordance with an embodiment of the present disclosure. The second connection line 60 can be used to connect to the anode 800 of the OLED. Those skilled in the art can understand that, in this case, the one electrode of the second source/drain 340 that is not connected to the second connection line 60 can be connected to one electrode of the first source/drain 440 through the first connection line 50. The one electrode of the first source/drain 440 that is not connected to the second source/drain 340 may be connected to another second connection line 60. The one electrode of the second source/drain 340 that is connected to the first source/drain 440 may also be connected to a further second connection line 60.

In some embodiments, a compensation capacitor structure with relatively strong compensation capability can also be formed. In the array substrate of the display device, particularly the back plate of the OLED, in order to improve the control capability for the thin film transistor, a compensation circuit is usually provided. By providing a component such as a compensation capacitor, the actual operating gate voltage of the thin film transistor can be maintained, such that it can be substantially consistent with the preset gate voltage. The components such as the above-mentioned compensation capacitor are usually fabricated simultaneously with some other structures. For example, when forming a certain layer of metal structures (such as electrodes, various types of wirings, connection lines, etc.), an island metal is reserved at a predetermined position during the patterning process. An insulating layer above the metal structures (such as the interlayer insulating layer, the passivation layer, the planarization layer, etc.) may serve as an insulating medium for the capacitive component. When forming metal structures above the insulating layer, another island metal structure is also reserved at the corresponding position. The compensation capacitor is formed by connecting the island metal structures to the circuit.

Figure 8:
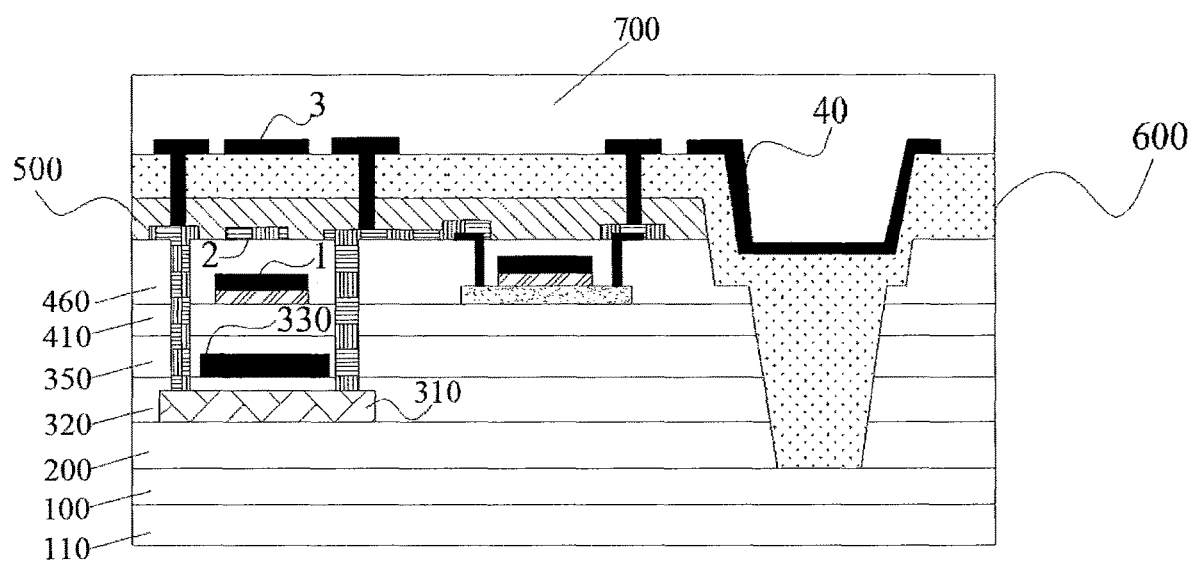
FIG. 8 schematically shows an array substrate in accordance with another embodiment of the present disclosure.

FIG. 8 schematically shows an array substrate in accordance with another embodiment of the present disclosure. In the foregoing embodiment, the third auxiliary electrode 1 may be simultaneously formed when forming the first gate electrode, and the first auxiliary electrode 2 may be simultaneously formed when forming the second source/drain and the first connection line. Finally, while forming the wiring 40, the second auxiliary electrode 3 is formed. The above-described three auxiliary electrodes are separated by insulating materials, and thus compensation capacitors with plurality of capacitors in parallel with each other can be easily formed, thereby increasing the pixel capacitance to greatly improve the control capability of the compensation circuit to the gate voltage.

Those skilled in the art will understand that the specific quantity of auxiliary electrodes, as well as the specific number of compensation capacitors in parallel, may be greater than that shown in FIG. 8. Similarly, in other embodiments of the present application, auxiliary electrodes may also be simultaneously formed at similar positions using the patterning processes of forming a metal conductive structure such as a gate, a pixel electrode, a common electrode, or the like.

It should be noted that modifications, substitutions and variations to the embodiments described above are possible within the scope of the present disclosure. For example, the planarization layer may or may not be filled in the groove. The wiring in the groove may be formed simultaneously with the first connection line or may be formed simultaneously with other wiring structures (e.g., the second connection lines). Those skilled in the art will understand that in the array substrate having only one kind of thin film transistor (such as a low temperature poly-silicon thin film transistor), the above-described method can also be used to make the fabrication process simpler. After forming the groove in the wiring area, the flexible material may not be filled. While forming the source/drain of the thin film transistor, a data line connected to the source/drain can be simultaneously formed. Filling the groove with the planarization layer can function as an insulator and enhance the mechanical performances of the wiring area. On the side of the planarization layer away from the substrate, another data line may be formed that has a same extending direction with the data line and the orthographic projection of which on the substrate coincides with the orthographic projection of the data line on the substrate. The data lines above the planarization layer can be connected to the source/drain through vias. Therefore, two data lines which are originally disposed in the same layer and in parallel (such as the power line VSS and the gate drive circuit GOA wiring connected to the control circuit) can be changed to overlap in the vertical direction, which can narrow the bezels of products. The above-described structure may be referred to as a dual source/drain technique. The data line that is located in the same layer as the second source/drain and is of the same material as the second source/drain is the first data line SD1, and the data line located in the layer above the second source/drain is the second data line SD2. Since insulation is required between the two metal wirings, a structure similar to the first planarization layer can be used as the insulating medium, and at the same time the insulating medium can fill the groove to improve the mechanical performances of the wiring area.

According to another aspect of the present disclosure, an array substrate is provided. The array substrate can be fabricated by the above-described method. Therefore, the array substrate has all the features and advantages of the array substrate obtained by the above-described method, which will not be described herein again. The array substrate may have a structure of an array substrate fabricated by the above-described method. Specifically, the array substrate comprises a display area and a wiring area. A groove is comprised in the wiring area. The array substrate further comprises a first thin film transistor and a second thin film transistor. In some embodiments, the first thin film transistor may be an oxide thin film transistor, and the second thin film transistor may be a low temperature poly-silicon thin film transistor. A distance between a first active layer of the first thin film transistor and a substrate is different from a distance between a second active layer of the second thin film transistor and the substrate. A first source/drain of the first thin film transistor is electrically connected to the first active layer through first vias, and a second source/drain of the second thin film transistor is electrically connected to the second active layer through second vias. One of the source/drain of the low temperature poly-silicon thin film transistor and one of the source/drain of the oxide thin film transistor are connected by a first connection line. The groove may comprise a first sub-groove and a second sub-groove that are stacked. The structures of the first sub-groove and the second sub-groove may be similar to those of the first sub-groove and the second sub-groove of the array substrate fabricated by the above-described method. Specifically, the second sub-groove is closer to the substrate than the first sub-groove. Depths of the first vias are substantially equal to the depth of the first sub-groove. Due to the influence of the factors such as the morphology of the first active layer and the semiconductor fabrication process, there may be some difference between the depths of the first vias and the depth of the first sub-groove. When the difference is within a certain range, it can still be considered that the depth of the first via is substantially equal to the depth of the first sub-groove, and is within the scope of the disclosure of the present application. In some embodiments, the difference can range from 0-1000 angstroms. The array substrate can combine the advantages of a low-temperature poly-silicon thin film transistor and an oxide thin film transistor, and has a simple fabrication process as well as relatively high product yield.

In some embodiments, the substrate can be a flexible substrate. A buffer layer is disposed between the substrate and the second active layer. The second sub-groove can penetrate the buffer layer and extend to a surface of the substrate facing towards the second active layer.

The array substrate may also comprise a passivation layer. The passivation layer may be disposed on a side of the thin film transistor away from the substrate. In some embodiments, the second source/drain is disposed on a side of the passivation layer away from the substrate and is connected to the second active layer penetrating through the passivation layer. In other embodiments, the second source/drain may be disposed on a side of the passivation layer adjacent to the substrate and connected to the second connection lines penetrating through the passivation layer. The wiring can be disposed in the groove. The second source/drain and the wiring may be located in the same layer and comprise the same material. Thus, the production yield and product performance of the array substrate can be further improved.

The array substrate may further comprise a first auxiliary electrode and a second auxiliary electrode. Specifically, the second source/drain 340, the first connection line 50 and the first auxiliary electrode 2 are located in the same layer and comprise the same material. The second connection lines 60, the wiring 40 and the second auxiliary electrode 3 are located in the same layer and comprise the same material. An insulating layer (such as at least one of the passivation layer 500 and the first planarization layer 600) is disposed between the first auxiliary electrode 2 and the second auxiliary electrode 3. The orthographic projection of the first auxiliary electrode 2 on the substrate 100 and the orthographic projection of the second auxiliary electrode 3 on the substrate 100 at least partially overlap, and the overlapping regions are located within an orthographic projection of the second active layer 310 on the substrate. Thereby, the pixel capacitance can be further improved, and the voltage compensation capability can be improved. As described above, the array substrate may comprise three capacitors connected in parallel to each other, thereby increasing the voltage compensation capability. The specific situation of form the compensation capacitor with the auxiliary electrodes has been described in detail above and will not be described herein again.

The array substrate described above has a same structure and advantageous effects as the array substrate fabricated using the above-described method, and will not be described herein again.

According to a yet another aspect of the present disclosure, a display device is also provided. The display device comprises the array substrate in accordance with embodiments of the present disclosure. Therefore, the display device has all the features and advantages of the above-described array substrate, and will not be described herein again.

In the description of the present disclosure, terms indicating the orientation or positional relationship, such as "on" and "under", are based on the orientation or positional relationship shown in the drawings. Such terms are only used to assist in describing embodiments of the present disclosure, and the embodiments of the present disclosure are not required to be constructed and operated in a particular orientation or positional relationship. These terms do not constitute a limitation of the present disclosure. In addition, the terms "first", "second" and similar terms are used for naming purposes only and are not to be construed as indicating or implying features such as relative importance, order, or quantity. In some instances, detailed descriptions of well-known devices and methods are omitted so as to not obscure the description of the devices and methods of the present disclosure. The specific terminologies used to describe a particular embodiment are not intended to limit the invention. Terms in the singular (such as "a", "the", etc.) are intended to comprise the same terms in plural as well, unless otherwise clearly indicated in the context. The term "comprising" indicates the existence of the stated feature, but does not exclude the presence or addition of one or more other features. It will also be understood that the description of the sequence of method steps in the specification is merely to illustrate of a flow. When a specific step of a method is described as being performed after another step, this specific step can be performed right after the another step, and it is also possible that one or more intermediate steps are performed before performing this specific step, unless otherwise stated. Similarly, it will be understood that when a connection between structures or components is described, the connection can be established directly or through an intermediate structure or component, unless otherwise stated.

We claim:

1. A method of fabricating an array substrate, wherein the array substrate comprises a display area and a wiring area, wherein the display area is provided with a first thin film transistor and a second thin film transistor, wherein a distance between a first active layer of the first thin film transistor and a substrate is different from a distance between a second active layer of the second thin film transistor and the substrate, wherein a first source/drain of the first thin film transistor is electrically connected to the first active layer through first vias, wherein a second source/drain of the second thin film transistor is electrically connected to the second active layer through second vias, wherein the wiring area is provided with a groove, and wherein the groove comprises a first sub-groove and a second sub-groove that are stacked, the method comprising:
simultaneously forming the first vias and the first sub-groove, and
simultaneously forming the second vias and the second sub-groove.

2. The method of claim 1, wherein depths of the first vias are substantially equal to a depth of the first sub-groove.

3. The method of claim 1, further comprising:
after simultaneously forming the first vias and the first sub-groove and before simultaneously forming the second vias and the second sub-groove, forming the first source/drain.

4. The method of claim 3, further comprising:
after simultaneously forming the second vias and the second sub-groove, simultaneously forming the second source/drain and a first connection line,
wherein the first connection line is connected to a first electrode of the first source/drain.

5. The method of claim 4, further comprising:
after forming the first source/drain and before simultaneously forming the second vias and the second sub-groove, forming a passivation layer which overlaps the first source/drain.

6. The method of claim 5, wherein simultaneously forming the second vias and the second sub-groove comprises:
simultaneously forming the second vias, the second sub-groove and a third via which penetrates the passivation layer,
wherein the third via extends to a surface of the first electrode of the first source/drain and is configured to receive the first connection line.

7. The method of claim 6, wherein simultaneously forming the second source/drain and the first connection line comprises:
simultaneously forming a wiring in the wiring area, the second source/drain and the first connection line,
wherein at least a portion of the wiring overlaps the passivation layer.

8. The method of claim 4, further comprising:
after simultaneously forming the second source/drain and the first connection line, forming a passivation layer which overlaps the first source/drain, the second source/drain and the first connection line.

9. The method of claim 8, further comprising:
after forming the passivation layer, forming a first planarization layer in the groove,
forming fourth vias which penetrate the first planarization layer, wherein two of the fourth vias extend to surfaces of the second source/drain, and
simultaneously forming a wiring in the wiring area and second connection lines,
wherein two of the second connection lines are connected to the second source/drain through the two of the fourth vias, and the wiring overlaps the first planarization layer.

10. The method of claim 9,
wherein simultaneously forming the second source/drain and the first connection line further comprises simultaneously forming the second source/drain, the first connection line and a first auxiliary electrode,
wherein the first auxiliary electrode is insulated from the second source/drain, and
wherein simultaneously forming the wiring in the wiring area and the second connection lines further comprises simultaneously forming the second connection lines, the wiring and a second auxiliary electrode,
wherein an orthographic projection of the second auxiliary electrode on the substrate at least partially overlaps with an orthographic projection of the first auxiliary electrode on the substrate.

11. The method of claim 1, wherein simultaneously forming the second vias and the second sub-groove comprises:
etching a portion of a bottom of the first sub-groove to form the second sub-groove.

12. The method of claim 1,
wherein the first thin film transistor comprises an oxide thin film transistor, and
wherein the second thin film transistor comprises a low temperature poly-silicon thin film transistor.

13. An array substrate, comprising:
a display area; and
a wiring area,
wherein the display area is provided with a first thin film transistor and a second thin film transistor,
wherein the first thin film transistor comprises an oxide thin film transistor, and the second thin film transistor comprises a low temperature poly-silicon thin film transistor,
wherein a distance between a first active layer of the first thin film transistor and a substrate is different from a distance between a second active layer of the second thin film transistor and the substrate,
wherein a first source/drain of the first thin film transistor is electrically connected to the first active layer through first vias,
wherein a second source/drain of the second thin film transistor is electrically connected to the second active layer through second vias,
wherein the wiring area is provided with a groove,
wherein the groove comprises a first sub-groove and a second sub-groove that are stacked, and
wherein depths of the first vias are substantially equal to a depth of the first sub-groove.

14. The array substrate of claim 13, further comprising:
a passivation layer on the first source/drain, wherein the second source/drain is connected to the second active layer through the second vias penetrating the passivation layer, and
a wiring in the wiring area, wherein the wiring at least partially overlaps the passivation layer,
wherein the second source/drain and the wiring are in a same layer and comprise a same material.

15. The array substrate of claim 13, further comprising:
a passivation layer on the first source/drain and the second source/drain,
a first connection line connecting a first electrode of the first source/drain to a first electrode of the second source/drain,
a first auxiliary electrode insulated from the second source/drain,
a planarization layer on the passivation layer and in the groove,
second connection lines, wherein two of the second connection lines are connected to the second source/drain through two of fourth vias penetrating the passivation layer and the planarization layer,
a second auxiliary electrode insulated from the second connection lines, wherein the second auxiliary electrode is on the planarization layer, and
a wiring in the wiring area wherein the wiring is on the planarization layer,
wherein the second source/drain, the first connection line and the first auxiliary electrode are in a same first layer and comprise a same first material, and
the second connection lines, the second auxiliary electrode and the wiring are in a same second layer and are of a same second material.

16. The array substrate of claim 15, wherein an orthographic projection of the first auxiliary electrode on the substrate at least partially overlaps with an orthographic projection of the second auxiliary electrode on the substrate.

17. A display device, comprising the array substrate according to claim 13.

* * * * *